US007015526B2

(12) United States Patent
Bonart

(10) Patent No.: US 7,015,526 B2
(45) Date of Patent: Mar. 21, 2006

(54) DYNAMIC MEMORY CELL AND METHOD OF MANUFACTURING SAME

(75) Inventor: Dietrich Bonart, Bad Abbach (DE)

(73) Assignee: Infineon Technologies AG, Munich (DE)

( * ) Notice: Subject to any disclaimer, the term of this patent is extended or adjusted under 35 U.S.C. 154(b) by 85 days.

(21) Appl. No.: 10/733,043

(22) Filed: Dec. 11, 2003

(65) Prior Publication Data

US 2004/0135187 A1   Jul. 15, 2004

(30) Foreign Application Priority Data

Dec. 11, 2002   (DE) ................... 102 57 873

(51) Int. Cl.
*H01L 27/108* (2006.01)
(52) U.S. Cl. .............. 257/301; 257/296; 257/302; 257/303; 257/304; 257/305
(58) Field of Classification Search ........ 257/296, 257/301, 302, 303, 304, 305
See application file for complete search history.

(56) References Cited

U.S. PATENT DOCUMENTS

| 6,172,390 B1 | 1/2001 | Rupp et al. |
| 6,255,684 B1 | 7/2001 | Roesner et al. |
| 6,339,239 B1 * | 1/2002 | Alsmeier et al. ............ 257/296 |
| 6,376,873 B1 * | 4/2002 | Furukawa et al. ........... 257/301 |

OTHER PUBLICATIONS

Buot, F.A., et al., "Dependence of Gate Control on the Aspect Ratio in Metal/Metal-Oxide/Metal Tunnel Transistors," Journal of Applied Physics, vol. 84, No. 2, Jul. 15, 1998, pp. 1133-1139.
Widmann, D., et al., "Technologie hochintegrierter Schaltungen," 2$^{nd}$ Ed., Ch. 8.4.2, pp. 290-293.

* cited by examiner

*Primary Examiner*—Mai-Huong Tran
(74) *Attorney, Agent, or Firm*—Slater & Matsil, L.L.P.

(57) ABSTRACT

A memory device has a plurality of memory cells, wherein each memory cell has a trench capacitor formed in a semiconductor substrate and an access transistor for it. Each access transistor has a first contact region connected to an internal electrode of the trench capacitor, a second contact region to a bit line and a control electrode region, wherein the control electrode regions of neighboring access transistors are connected by a word line formed in the semiconductor substrate.

19 Claims, 6 Drawing Sheets

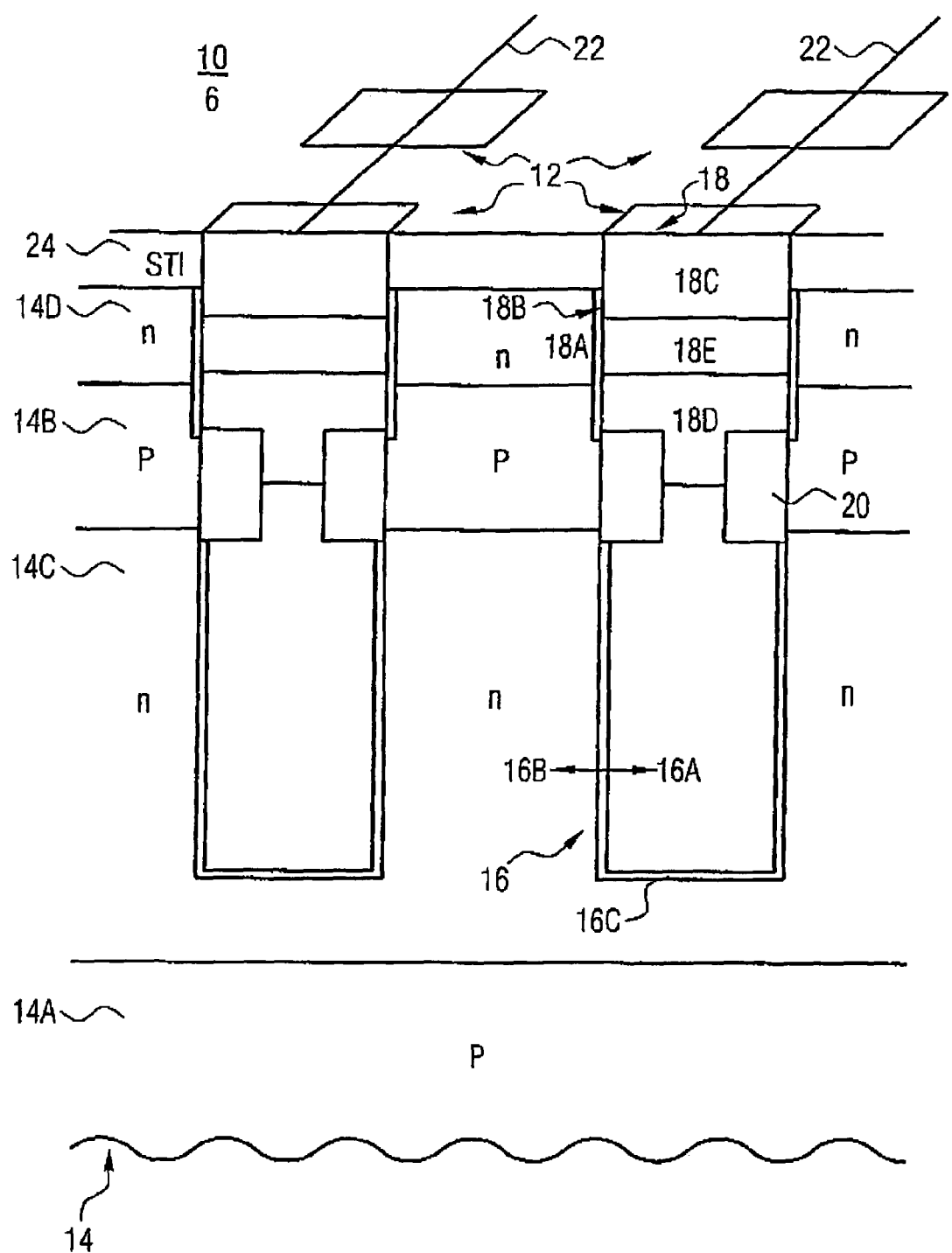

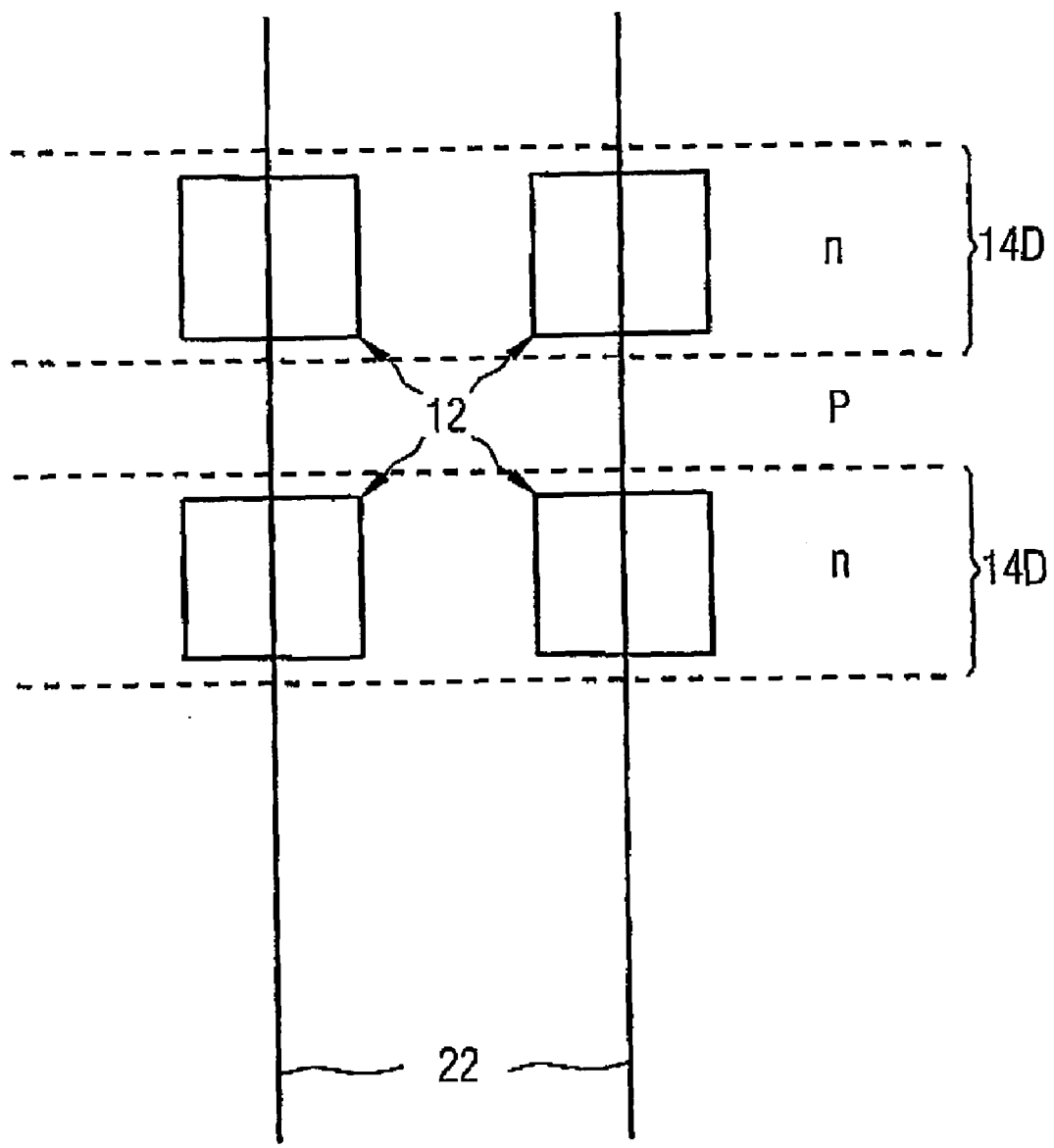

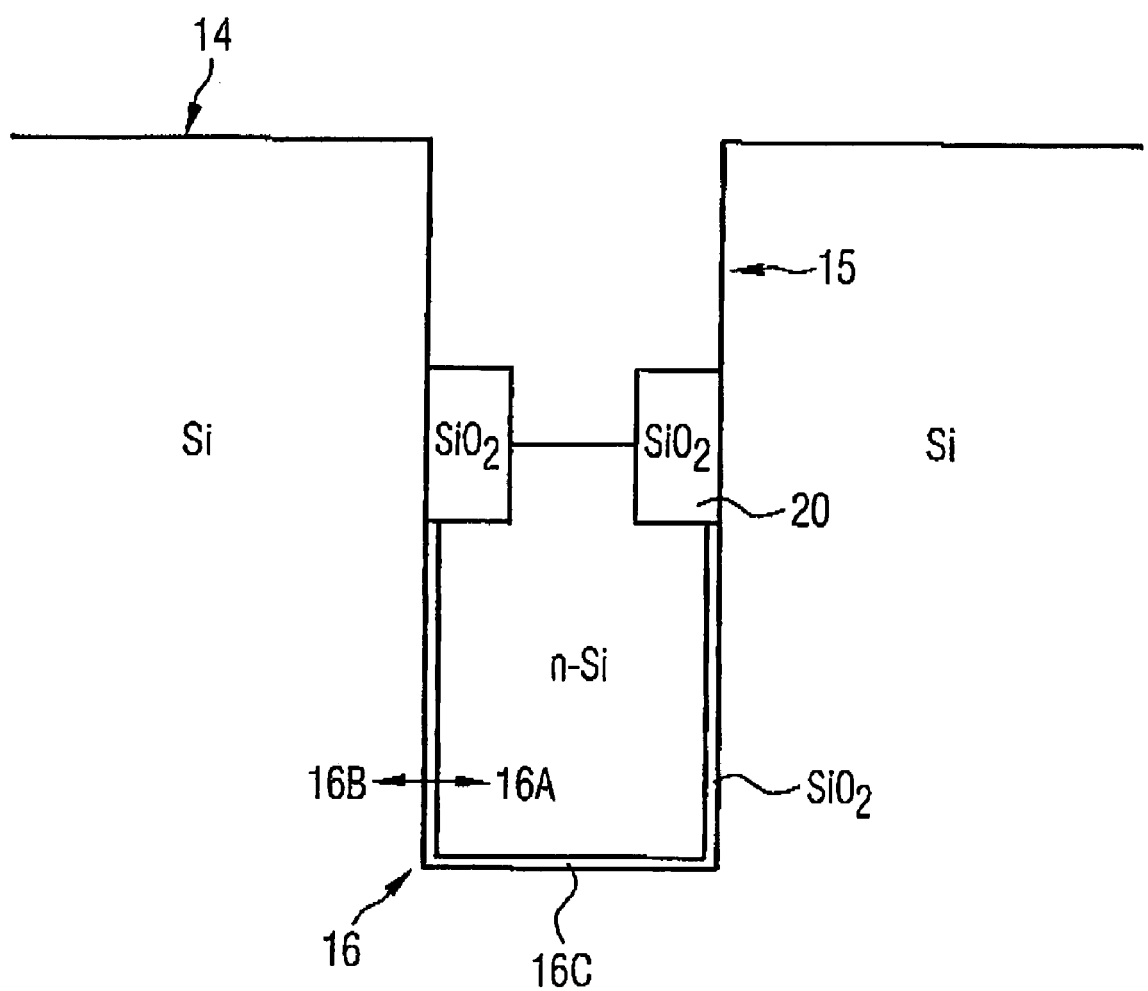

WL = word line
BL = bit line
P = common capacitor plate vertical MOSFET

US 7,015,526 B2

DYNAMIC MEMORY CELL AND METHOD OF MANUFACTURING SAME

BACKGROUND OF THE INVENTION

1. Field of the Invention

The present invention relates to semiconductor memory elements and to manufacturing same, and, in particular, to dynamic semiconductor memory cells as are, for example, employed for DRAM memories, and to manufacturing same.

2. Description of Prior Art

Dynamic memory cells typically consist of a so-called selection or access transistor and a memory capacitor. FIGS. 4a and 4b show a schematic cross section of a technological realization of a dynamic memory cell known in the prior art having a trench capacitor and an electric equivalent circuit diagram of this memory cell. The reference numerals in both illustrations designate the individual circuit elements and the respective local association of the individual circuit elements in the memory cell integrated in a semiconductor chip.

As can be seen from FIG. 4a, dynamic memory cells, such as, for example, DRAM memory cells, comprise two main components, namely a memory capacitor 54 storing the charge and an access transistor 52 transferring the charge into and out of the memory capacitor 54. The memory capacitor 54 can be a trench capacitor etched into the semiconductor substrate.

The memory cell 50 according to the prior art, exemplarily illustrated in FIG. 4b, as is, for example, illustrated in the book "Technologie Hochintegrierter Schaltungen" (Technology of Large-Scale Integrated Circuits) by D. Widmann, H. Mader and H. Friedrich, $2^{nd}$ edition, chapter 8.4.2, pp. 290–293, comprises an access transistor 52 and a trench capacitor 54. The access transistor 52 includes a gate terminal 52a, a drain terminal 52b, a source terminal 52c and a bulk terminal 52d. The trench capacitor 54 has a first terminal 54a and a second terminal 54b. The gate terminal 52a of the access transistor 52 is connected to a word line 56. The drain terminal 52b of the access transistor 52 is connected to a bit line 58. The source terminal 52c of the access transistor 52 is connected to the first terminal 54a of the trench capacitor 54, wherein the second terminal 54b of the trench capacitor 54 has the effect of a common capacitor plate.

In order to write data to the memory cell 50, a predetermined voltage is applied to the word line 56 so that the access transistor 52 connected to the word line 56 becomes conductive. Thus, the charge fed by the bit line 58 is collected in the trench capacitor 54.

When reading data, a predetermined voltage is applied to the word line 56 to connect the access transistor 52 through so that the charge stored in the trench capacitor 54 can be read out to the bit line 58.

In the following, an exemplary realization of a dynamic memory cell 50 having a trench capacitor 54, that is in particular a trench capacitor having a buried plate, in a semiconductor chip and its manufacture will be discussed referring to FIG. 4b by means of generalized and simplified expressions.

A trench 62 is, for example, formed in a p-doped single crystal silicon substrate 60 serving as the starting material by anisotropic plasma etching. Subsequently, a thin ONO dielectric layer 64 (ONO=oxide nitride oxide) is formed in the deep trench 62, wherein this dielectric layer adopts the function of the dielectric between the electrodes 54a, 54b of the plate capacitor 54. Subsequently, the trench 62 is filled with a polysilicon material or a highly doped $n^+$-type silicon material in order to form one capacitor electrode 54a, wherein the semiconductor material surrounding the ONO dielectric layer 64 forms the second capacitor electrode 54b.

The so-called buried plate 66 completely surrounding the trench 62 is then formed in the p-doped substrate material 60 by implantation. Above the buried plate 66, a p-type well 68 is implanted to about the depth of the oxide collar 64a, the p-type well 68 having the effect of the p-type bulk region of the access transistor 52. The bulk terminal 52d of the access transistor 52 is connected to the p-type bulk region 68.

As is illustrated in FIG. 4b, a field effect transistor 52 having a source region 52c, a drain region 52b and an n channel region defined therebetween is formed in the p-type bulk region 68 adjacent to the trench capacitor 54. The gate terminal region 52a is formed in an isolating layer 70 ($SiO_2$) arranged above the substrate material. As is illustrated in FIG. 5b, a so-called surface strap contact 72 connecting the source region 52c of the field effect transistor 52 to the first electrode 54a of the trench capacitor 54 is also formed. In the isolating layer 70, the gate terminal (control electrode) 52a of the field effect transistor 52 is, for example, formed of a polysilicon material, wherein the gate terminal 52a is connected to the word line 56. In addition, an electrically conductive connection from the bit line 58 which, for example, consists of polyizide, wolfram or aluminum, to the drain terminal 52b of the field effect transistor 52 is formed through the isolating layer 70.

As is illustrated in FIG. 4b, the surface strap contact 72 produces a connection between a diffusion region, i.e. the n-type source region 52c of the field effect transistor 52, and the polysilicon region of the interior electrode 54a of the trench capacitor 54. This strap contact 72 which in the memory cell 50 is formed between the memory trench 62, i.e. the memory capacitor 54, and the access transistor 52, on the one hand, is a very important connecting element in memory cells, wherein, on the other hand, this connecting element is extremely sensitive to manufacture in memory cell arrangements 50 and thus is problematic for the characteristics of the memory cell.

As it is known, efforts for developing ever-smaller dynamic memory cells (DRAM cells) are a well-known goal in the field of semiconductor technology, wherein optimizing the memory cells as regards both the manufacturing cost and the cell density is strived for. Thus, the cell density on a DRAM chip and, at the same time, the performance of the memory elements has drastically increased over the last few years due to improvements in semiconductor technologies. If, however, the cell density on a DRAM chip is increased, it is, on the other hand, necessary to decrease the area of the individual cell in order to be able to maintain a sensible overall chip size.

Due to the continuing decrease of the structure size as mentioned above, problems in contacting the memory cells increasingly develop in DRAM cells, wherein an effective and area-saving contacting to the word lines and bit lines is particularly required to make a further miniaturization of memory cells possible.

SUMMARY OF THE INVENTION

It is the object of the present invention to provide an improved memory device having a plurality of memory cells having simplified and improved contacting to the word lines and bit lines in order to make a further decrease of the structure sizes of DRAM memory cells possible.

In accordance with a first aspect, the present invention provides a memory device having a plurality of memory cells, wherein each memory cell has a trench capacitor formed in a semiconductor substrate and an access transistor for it, wherein each access transistor has a first contact region connected to an inner electrode of the trench capacitor, a second contact region connected to a bit line and a control electrode region, wherein the control electrode regions of neighboring access transistors are connected by a word line formed in the semiconductor substrate.

In accordance with a second aspect, the present invention provides a method of manufacturing a memory device having a plurality of memory cells, having the following steps: providing a semiconductor substrate; forming a trench in the semiconductor substrate; forming a signal memory capacitor in the trench in the semiconductor substrate; forming an access transistor above the signal memory capacitor in the trench, wherein the access transistor has a first contact region connected to an internal electrode of the signal memory capacitor, a second contact region connected to a bit line and a control electrode region; and forming a highly doped word line region in the semiconductor substrate, wherein the control electrode region of the access transistor is connected to the highly doped word line region.

According to an embodiment of the invention, in the inventive method of manufacturing a memory device having a plurality of memory cells, a semiconductor substrate having a first region of a first conductivity type and an underlying second region of a second conductivity type is provided first. Subsequently, a trench capacitor is formed in a trench in the semiconductor substrate, wherein the trench extends over the first and second regions in the semiconductor substrate. Finally, an access transistor associated to the trench capacitor, having a control electrode region, a bit line contact region, a trench capacitor contact region and a channel region is formed, wherein the trench capacitor contact region of the access transistor is connected to the associated trench capacitor. Finally, a highly doped word line region of the first conductivity type is formed completely in the first region of the semiconductor substrate so that the word line region is separated from the second region, wherein the word line region is connected to the control electrode region of the access transistor.

The present invention is based on the finding to modify a memory cell for a memory device, such as, for example, a DRAM memory, consisting of a trench capacitor and an associated access transistor in such a way that the word line to which the control electrode region of the access transistor of the memory cell is connected extends within the semiconductor substrate and can be contacted outside the memory cell region so that no additional contact region led to the outside is required in the region of the individual memory cell for connecting the word line. For this, a vertical transistor, preferably a vertical MOSEFT, in connection with a buried word line, is used in the memory cell, wherein the control electrode region, i.e. its gate terminal region, of the vertical transistor is connected to the buried word line region extending in the semiconductor substrate.

The control electrode region of the vertical MOSFET can, for example, either be only connected to the buried word line in a defined limited region or the control electrode region of the vertical MOSFET can, for example, also be embodied as a so-called "surrounded gate" terminal region in which the gate terminal region completely surrounds the channel region of the MOSFET. Thus, in particular so-called vertical MOSFETs can be employed in the present invention with exceptional advantage.

The buried word line, according to the invention, is defined by a highly doped region in the semiconductor substrate, which can, for example, be formed in the semiconductor substrate by well-known implantation methods.

Since a very large number of memory cells with corresponding bit lines and word lines in or on the semiconductor substrate must be integrated for manufacturing a DRAM memory cell chip, problems in contacting the individual memory cells resulting from an increasing decrease of the structure size can be solved with the inventive memory cell arrangement comprising a trench capacitor and a vertical access transistor, in combination with a buried word line.

Thus it is possible with the help of the inventive memory device to considerably reduce the size of a DRAM cell field consisting of a plurality of individual memory cells by simplifying the contacting of the individual memory cells by providing buried word lines. In the field of DRAM memory cell technology, this is a great progress since miniaturizing semiconductor elements is one of the main goals in technological developments in the field of semiconductor electronics.

BRIEF DESCRIPTION OF THE DRAWINGS

Preferred embodiments of the present invention will be detailed subsequently referring to the appended drawings, in which:

FIG. 1 is a sectional view of an inventive memory device having a plurality of memory cells according to a first embodiment of the present invention;

FIG. 2 is a top view of the inventive memory device having a plurality of memory cells according to the first embodiment of the present invention;

FIGS. 3a–b show two intermediate states of the inventive method of manufacturing a memory device having a plurality of memory cells;

DESCRIPTION OF PREFERRED EMBODIMENTS

Figure 3B:
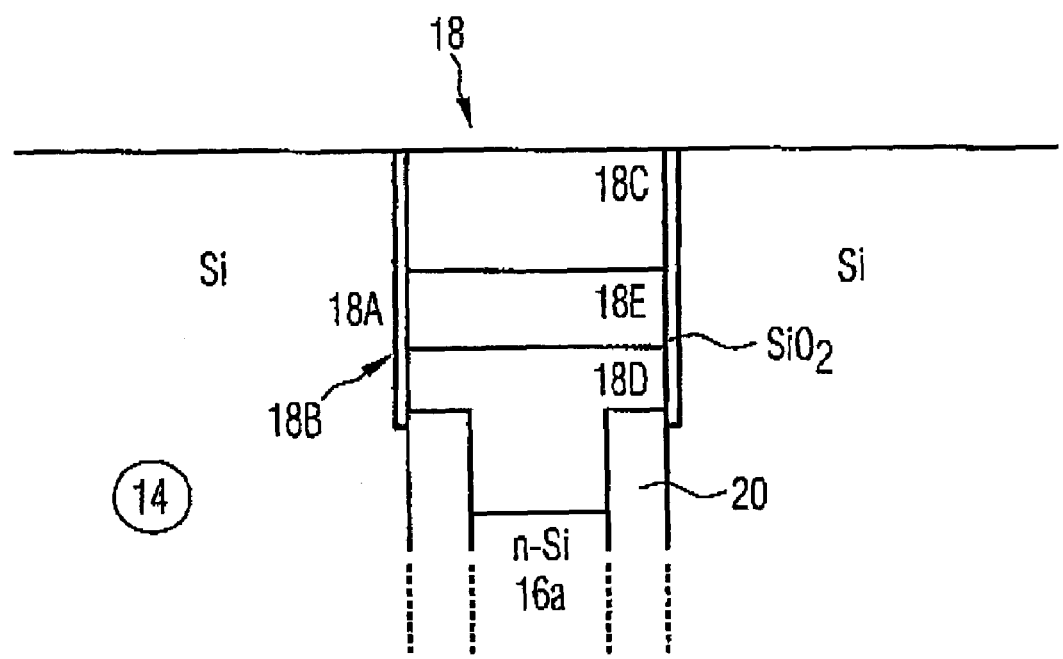
Figure 4B:
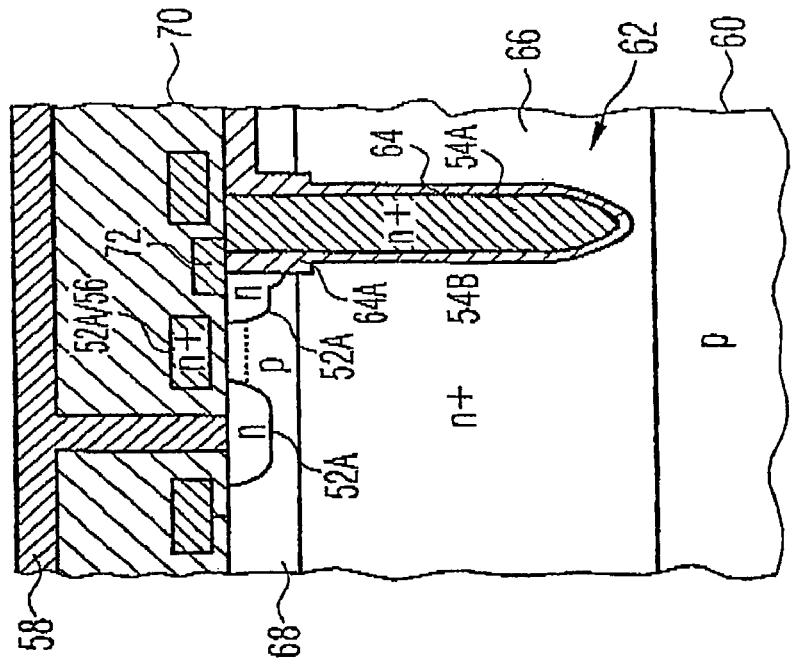
FIGS. 4a–b show a dynamic memory cell having a trench capacitor and the electric equivalent circuit diagram according to the prior art.
Figure 4A:
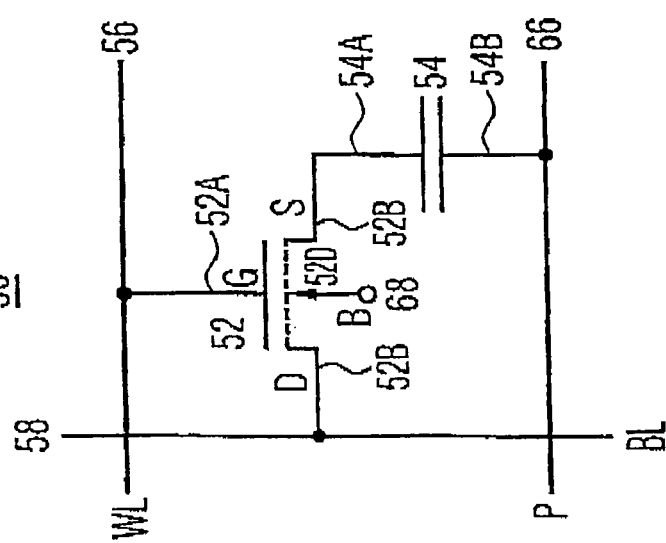

Referring to FIGS. 1 and 2, a first preferred embodiment of a memory device 10 having a plurality of memory cells 12 will be described in greater detail.

In FIG. 1, several memory cells 12 are illustrated, wherein two memory cells are illustrated in a sectional and side view, respectively, and two further memory cells are illustrated in a top view.

The memory cell 12 is formed in a semiconductor substrate 14 preferably having a p-type semiconductor starting material 14a. A first region 14b of a first conductivity type, preferably of a p conductivity type, and an underlying second region 14c of a second conductivity type, preferably an n conductivity type, are formed in the semiconductor substrate 14. In the semiconductor substrate 14, a trench memory capacitor 16 is also formed in a trench in the semiconductor substrate 14, wherein the trench extends over the first and the second region 14b, 14c of the semiconductor substrate 14.

Each trench capacitor 16 has a signal memory region 16a and a reference voltage region 16b, separated from each other by an electric isolator 16c. The reference voltage region 16b of the trench capacitor 16 is connected to the second region 14c of the semiconductor substrate 14 or formed by the second region 14c of the semiconductor substrate 14. The signal memory region 16a of the trench capacitor 16 is preferably formed by a highly doped semiconductor material, such as, for example, an $n^+$-type silicon, or by a conductive polysilicon material, wherein any suitable conductive materials can generally be used for the signal memory region 16a.

An access transistor 18 associated to the trench capacitor (signal memory capacitor) 16 is formed above the trench capacitor 16. The access transistor 18 has a control electrode region 18a having a control electrode oxide region 18b, a bit line contact region 18c, a trench capacitor contact region 18d and a channel region 18e, wherein the trench capacitor contact region 18d of the access transistor 18 is connected to the signal memory region 16a of the associated trench capacitor 16.

As can be seen in FIG. 1, a word line region 14d preferably having a relatively high doping of the n conductivity type is also formed completely in the first region 14b of the semiconductor substrate 14.

Since the highly doped word line region 14d is completely formed in the first region 14b of the semiconductor substrate 14, the highly doped word line region 14d is separated from the second region 14c of the semiconductor substrate 14 both locally and electrically. In addition, it becomes clear from FIG. 1 that the word line region 14d is connected to the control electrode region 18a of the access transistor 18 or the control electrode region 18a of the access transistor is formed by the portion of the buried highly doped word line region 14d abutting on the control electrode oxide region 18d of the access transistor 18, respectively.

Figure 5A:
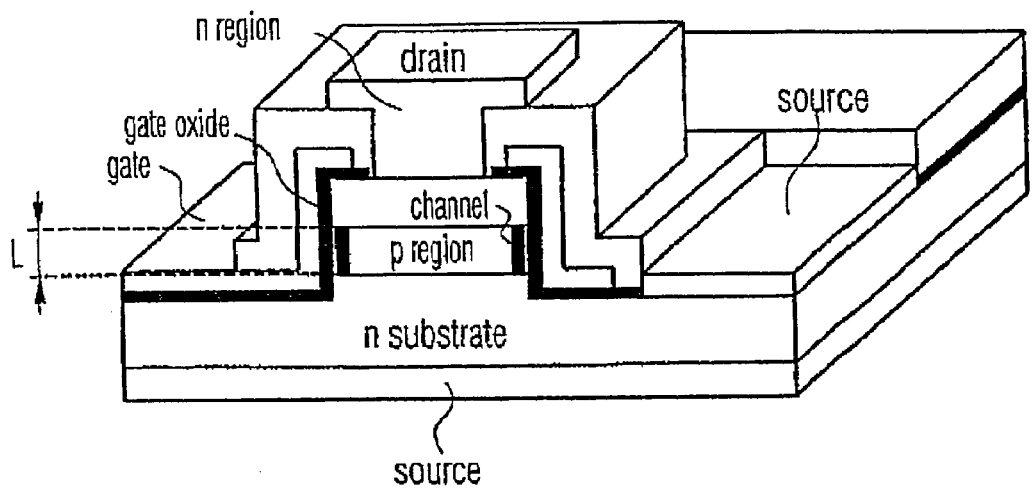
FIGS. 5a–b show principle illustrations of a vertical MOSFET and a tunnel transistor according to the prior art.
Figure 5B:
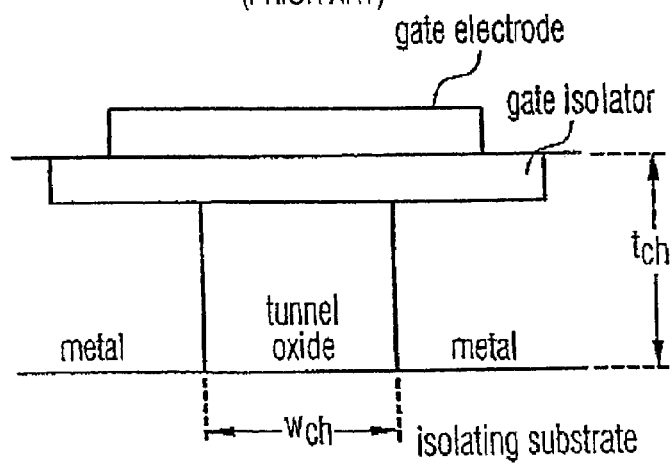

In the embodiment illustrated in FIG. 1, the access transistor is a vertical tunnel transistor, wherein the bit line contact region 18c is a metal region, the channel region 18e is a metal oxide region and the trench capacitor contact region 18d is a metal region. The control electrode region 18a, in connection with the control electrode oxide region 18b, is preferably the gate terminal region of the transistor. A principle illustration of a well-known tunnel transistor is, for example, illustrated in FIG. 5b, wherein such a tunnel transistor is, for example, described in greater detail in the scientific publication "Dependence of gate control on the aspect ratio in metal/metal-oxide/metal tunnel transistors" of F. A. Buot et al. in Journal of Applied Physics, vol. 84, no. 2, pp. 1133–1139, Jul. 15, 1998.

It is, however, to be obvious that, instead of a tunnel transistor, as is illustrated in FIG. 1, any other vertical field effect transistors, such as, for example, vertical MOSFETs, can be employed according to the invention. It is only essential that the control electrode region 18b of the transistor used is connected or contacted to the buried word line region 14d. A principle illustration of a well-known vertical MOSFET is exemplarily illustrated in FIG. 5a.

As is also illustrated in FIG. 1, a so-called oxide collar is arranged between the access transistor 18, i.e. the trench capacitor contact region 18d of the access transistor 18, and the signal memory region 16a of the trench capacitor 16 so that there is a contact area reduced by the oxide collar 20 between the trench capacitor contact region 18b and the signal memory region 16a.

As can also be seen from FIG. 1, the bit line contact region 18c of each access transistor 18 is connected to an associated bit line 22.

In addition, a so-called shallow trench isolation (STI) 24 is illustrated in FIG. 1, which is provided optionally so that the multiple arrangement of memory cells is surrounded by an isolation region in the deep trenches and the memory cells 12 are electrically isolated from one another.

As has been indicated above, the access transistor 18 preferably is a field effect transistor having a channel region 18e, wherein the control electrode region 18a of the access transistor 18, and thus the buried word line region 14d, is separated from the channel region 18e of the access transistor 18 by the oxide layer 18b (gate oxide layer=GOX). The layer thickness of the oxide layer 18b is, for example, in a range of 0.5 to 15 nm and preferably in a range of 3 to 6 nm. An $SiO_2$ material is, for example, used as the material for the oxide layer, wherein any suitable isolation material having suitably selected layer thicknesses can be utilized depending on the respective selected setup of the access transistor.

As has already been mentioned, the access transistor 18 is preferably formed as a vertical field effect transistor, wherein at least the channel region 18e of the transistor 18 is formed in the trench in the semiconductor substrate 14, so that the buried word line 14d can effectively control the channel region 18e via the control electrode region 18a of the access transistor. Departing from the technological realization of the field effect transistor used, the control electrode region 18b of the field effect transistor can be located on only one side or region of the trench, wherein it is also possible to provide the control electrode region 18b of the access transistor 18 on several sides of the trench. When the control electrode region 18a having the gate oxide layer 18b completely surrounds the channel region 18e of the access transistor 18, this is called a "surrounded gate terminal".

The access transistor 18 illustrated in FIG. 1 is formed as a so-called tunnel transistor, as is, for example, illustrated in the scientific publication in "Journal of Applied Physics" cited above. It should, however, be obvious that generally any transistor, i.e. preferably vertical MOSFETs, can be employed to adopt the function of the access transistor 18, wherein it only has to be ensured that the control electrode region of the respective transistor can be controlled by the buried word line 14d in the semiconductor substrate.

The buried word line 14d in the semiconductor substrate 14, which, preferably, has a high n-type doping for decreasing the line resistance, is preferably formed by an implantation method in the first region 14b of the semiconductor substrate 14, wherein this region 14b, as has already been mentioned, preferably comprises an n-type doping.

As is made clear in FIG. 1 and in connection with FIG. 2, a plurality of individual memory cells 12 can be combined to a memory cell field of an DRAM memory chip, wherein it is then made possible due to the buried word lines 14d to contact the word line regions 14d outside the individual memory cells 12.

Thus the contacting of individual memory cells 12 of the DRAM memory device 10 to the respective word and bit lines can be realized in future with an ever increasing decrease of the structural size of memory elements by inserting a buried word line extending within the semiconductor substrate which can be contacted outside the memory cell according to the invention.

A memory cell field having a reduced size can be realized by the inventive arrangement of a memory device having a plurality of memory cells, in connection with a buried word line.

Thus, a plurality of memory cells 12 are usually combined to a memory cell field in a DRAM memory arrangement, wherein a memory cell field will then comprise a large number of parallel word lines 14d and a large number of parallel bit lines 22 which are arranged perpendicularly to one another, i.e. in a matrix form, in columns or rows, wherein the individual memory cells 12 are formed at the intersections of the word lines 14d and the bit lines 22. In general, one end of each word line 22 is connected to a row decoder and one end of each bit line is connected to a read amplifier and, in addition, to a column decoder.

In operation, a certain memory cell 12 is selected by the row decoder selecting one of the word lines 14d on the basis of an external address signal and by the column decoder selecting one of the bit lines 22 on the basis of an external address signal, wherein thus the memory cell 12 located at the intersection of the selected word line 14d and bit line 22 is selected. Corresponding to this selecting operation of the memory cell 12, a charge stored in the trench capacitor 16 of the memory cell 12 is read out or data in the form of a charge is written to the trench capacitor 16. When reading data from the memory cell 12, the charge collected in the trench capacitor 16 of the selected memory cell 12 is detected by the read amplifier and amplified before reading.

Referring to FIGS. 3a and 3b, a preferred method of manufacturing an inventive memory device having a plurality of memory cells will be described subsequently.

As a starting point for the inventive method of manufacturing a memory device having a plurality of memory cells 12, there is a standard trench cell 15 after manufacturing the oxide collar 20, as is illustrated in FIG. 3a.

The individual method steps for manufacturing the memory cell 12 of FIG. 1 comprising the vertical access transistor 18 in connection with the buried word line 14d are illustrated subsequently.

At first, a thermal gate oxide layer having a film thickness of, for example, 0.5 to 15 nm and preferably having a film thickness in a range of 3 nm to 6 nm is grown in the trench 15, wherein this oxide layer later will have the effect of the control electrode oxide region 18d. Subsequently, a contact to the signal memory region 16a of the trench capacitor 16 is exposed by means of etching, wherein the material of the signal memory region 16a is, for example, a trench polysilicon material or a highly doped silicon material.

After that, the trench 15 is filled with a metal, such as, for example, Nb or Ti. The metal is then selectively etched back to obtain the trench capacitor contact region 18d of the access transistor 18. Subsequently, oxidation is performed to produce the metal oxide layer 18e having the channel region of the transistor. Finally, the remaining part of the trench 15 is filled again with metal to obtain the bit line contact region 18c of the tunnel transistor structure 18.

Thus, the arrangement illustrated in FIG. 3b of the layer sequence of the metal region 18d, the metal oxide region 18e and the metal region 18c results in the access transistor 18 in the form of the trench capacitor contact region 18d, the oxide layer 18b and the bit line contact region 18c of the tunnel transistor 18.

The channel region in the metal oxide 18e of the vertical tunnel MOSFET 18 is defined by the arrangement illustrated in FIG. 3b.

The so-called buried plate 14c (second region 14c in the substrate material 14) is then formed by implantation, wherein this buried plate 14c represents the second capacitor plate 54b of the trench capacitor 54 and thus contacts the memory cell 12 from outside. The buried plate 14c preferably has an n-type conductivity. The buried plate 14c thus forms the trench capacitor contact region 16b of the trench capacitor 16 and thus the second capacitor plate 54b of the trench capacitor 54.

Subsequently, the first region 14b (p-type conductivity) is formed in the semiconductor substrate above the buried plate 14c by another implantation process. The first region 14b has the effect of a so-called p-well isolation and electrically decouples the memory cell in the level of the oxide collar 20.

The new additional process step for manufacturing the buried word line 14d will be explained in greater detail hereinafter.

A mask layer defining (for example leaving open) those regions in which the buried word line 14d in the semiconductor substrate 14 is to be, is deposited on the semiconductor substrate 14. Subsequently, an implantation process, i.e. a shallow implantation of, for example, arsenic or another suitable doping material, is performed to form the one or several word lines 14d in the semiconductor substrate 14.

Subsequently, an oxidation of the surface of the semiconductor substrate 14 is performed optionally to obtain the STI layer 24 (trench isolation layer). Finally, contact-etching through this isolation layer 24 to the metal contacts 18c (i.e. the bit line contact regions 18c of the access transistor 18) is performed, whereupon the bit lines 22 are connected to the bit line contact regions 18c of the access transistors 18 in another step.

It is to be mentioned that the method of manufacturing a memory device having a plurality of memory cells has been described hereinbefore only exemplarily in the context of the method steps for manufacturing a tunnel transistor. It is to be obvious that practically any transistor structures, i.e. preferably vertical MOSFETs, can be employed to adopt the function of the access transistor 18, wherein it only has to be ensured that the control electrode region of the respective transistor can be controlled by the buried word line 14d in the semiconductor substrate.

It is also to be noted that the respective conductivity types described of the semiconductor material used are only to be considered as exemplary or preferred embodiments to realize the inventive memory device.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A memory device having a plurality of memory cells, wherein each memory cell comprises a trench capacitor formed in a trench of a semiconductor substrate and an access transistor for said trench capacitor, wherein each access transistor comprises a first contact region connected to an internal electrode of the trench capacitor, a second contact region connected to a bit line, a channel region and a control electrode region, wherein the channel region of the access transistor is formed in the trench, and wherein the control electrode regions of neighboring access transistors are connected by a word line formed in the semiconductor substrate.

2. The memory device according to claim 1, wherein the semiconductor substrate comprises a first semiconductor layer arranged in parallel to the semiconductor surface of a first conductivity type and an underlying implanted second semiconductor layer arranged in parallel to the semiconductor surface of a second conductivity type, wherein the trench of the memory cell extends through the first and second semiconductor layers.

3. The memory device according to claim 1, wherein the access transistor is a field effect transistor, wherein the control electrode region of the access transistor has an oxide layer separating the channel region of the access transistor from the control electrode region.

4. The memory device according to claim 3, wherein the layer thickness of the control electrode oxide layer is in a range of 0.5 to 15 nm and is preferably in a range of 3 to 6 nm.

5. The memory device according to claim 3, wherein the control electrode oxide layer comprises an $SiO_2$ material.

6. The memory device according to claim 1, wherein the access transistor is a vertical field effect transistor.

7. The memory device according to claim 6, wherein the control electrode region completely surrounds the channel region of the access transistor.

8. The memory device according to claim 6, wherein the control electrode region completely surrounds the trench of the memory cell.

9. The memory device according to claim 1, wherein the access transistor is a tunnel transistor.

10. The memory device according to claim 1, wherein the word line is a highly doped region buried in the semiconductor substrate.

11. The memory device according to claim 10, wherein the word line is a highly doped region of the second conductivity type completely formed in the first semiconductor layer of the semiconductor substrate and surrounded by it, and is isolated from the second semiconductor layer by the first region.

12. The device according to claim 11, wherein the first semiconductor layer, the second underlying semiconductor layer and the highly doped word line region are formed by means of implantation in the semiconductor substrate.

13. The memory device according to claim 10, wherein the highly doped word line region is connected to the control electrode region of the access transistor.

14. The memory device according to claim 1, wherein the highly doped word line region can be contacted outside the memory cell.

15. The memory device according to claim 1, wherein a plurality of memory cells can be combined to a memory cell field.

16. The memory device according to claim 1, wherein the first conductivity type is a p conductivity type and the second conductivity type is an n conductivity type.

17. The memory device according to claim 1, wherein the first conductivity type is an n conductivity type and the second conductivity type is a p conductivity type.

18. The memory device according to claim 1, wherein the word line forms the control electrode region of the access transistor.

19. A memory device having a plurality of memory cells, each memory cell comprising a trench capacitor formed in a trench of a semiconductor substrate and an access transistor for said trench capacitor, each access transistor comprising a first contact region connected to an internal electrode of the trench capacitor, a second contact region connected to a bit line, a channel region and a control electrode region, the channel region of the access transistor being formed in the trench, the control electrode regions of neighboring access transistors being connected by a word line formed in the semiconductor substrate, and the word line being a highly doped region buried in the semiconductor substrate.

* * * * *